(12) United States Patent
Kim et al.

(10) Patent No.: US 12,514,084 B2
(45) Date of Patent: Dec. 30, 2025

(54) DISPLAY DEVICE

(71) Applicant: Samsung Display Co., LTD., Yongin-si (KR)

(72) Inventors: Hyuk Kim, Suwon-si (KR); Yang-Hwa Choi, Hwaseong-si (KR); Junghwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 227 days.

(21) Appl. No.: 17/361,712

(22) Filed: Jun. 29, 2021

(65) Prior Publication Data
US 2022/0115494 A1   Apr. 14, 2022

(30) Foreign Application Priority Data

Oct. 14, 2020 (KR) .......................... 10-2020-0132654

(51) Int. Cl.
*H10K 59/131* (2023.01)

(52) U.S. Cl.
CPC ................................ *H10K 59/1315* (2023.02)

(58) Field of Classification Search
CPC .................................................. H10K 59/1315
See application file for complete search history.

(56) References Cited

U.S. PATENT DOCUMENTS

| | | | | |
|---|---|---|---|---|
| 2010/0025664 A1* | 2/2010 | Park | ...................... | H10K 59/878 438/34 |
| 2016/0329393 A1* | 11/2016 | Seo | ...................... | G09G 3/3275 |
| 2017/0077205 A1* | 3/2017 | Kim | ...................... | H10K 50/824 |
| 2017/0102578 A1* | 4/2017 | Shin | ................... | G02F 1/133514 |
| 2019/0206969 A1* | 7/2019 | Hwang | ................. | G09G 3/3225 |
| 2019/0245014 A1* | 8/2019 | Park | ........................ | H10K 59/12 |
| 2019/0251378 A1* | 8/2019 | Jung | .......................... | G01S 1/72 |
| 2020/0219453 A1 | 7/2020 | Park et al. | | |
| 2021/0208464 A1* | 7/2021 | Liu | ................... | G02F 1/133512 |
| 2022/0208948 A1* | 6/2022 | Xu | ......................... | H10K 50/87 |
| 2022/0317851 A1* | 10/2022 | Ye | ......................... | H10K 50/844 |

FOREIGN PATENT DOCUMENTS

| | | |
|---|---|---|
| KR | 10-2015-0000027 A | 1/2015 |
| KR | 10-2015-0068830 | 6/2015 |
| KR | 10-1762344 | 7/2017 |

(Continued)

OTHER PUBLICATIONS

Office Action issued Aug. 21, 2025 by the Korean Patent Office for KR Patent Application No. 10-2020-0132654.

*Primary Examiner* — Eric K Ashbahian
(74) *Attorney, Agent, or Firm* — Sughrue Mion, PLLC (57) ABSTRACT

A display device includes: a plurality of pixels disposed in a display area; a plurality of first voltage lines electrically connected to the plurality of pixels, the plurality of first voltage lines including a plurality of first common voltage lines extending in a first direction and a plurality of second common voltage lines extending in a second direction intersecting the first direction; and a plurality of second voltage lines electrically connected to the pixels, the plurality of second voltage lines including a plurality of first driving voltage lines extending in the first direction and a plurality of second driving voltage lines extending in the second direction. The number of the first common voltage lines are greater than the number of the first driving voltage lines.

18 Claims, 8 Drawing Sheets

(56) References Cited

FOREIGN PATENT DOCUMENTS

| | | |
|---|---|---|
| KR | 10-1812215 | 12/2017 |
| KR | 10-2019-0082355 A | 7/2019 |
| KR | 10-2019-0094265 A | 8/2019 |
| KR | 10-2019-0098877 A | 8/2019 |
| KR | 10-2061791 | 1/2020 |
| KR | 10-2020-0086771 | 7/2020 |
| KR | 10-2137897 | 8/2020 |

* cited by examiner

DISPLAY DEVICE

CROSS REFERENCE TO RELATED APPLICATION

This application claims priority from and the benefit of Korean Patent Application No. 10-2020-0132654, filed on Oct. 14, 2020, which is hereby incorporated by reference for all purposes as if fully set forth herein.

BACKGROUND

Field

Embodiments of the invention relate generally to a display device and more specifically, to a display device with a vertical voltage line and a horizontal voltage line.

Discussion of the Background

An organic light emitting display includes two electrodes and an organic emission layer interposed therebetween, an electron injected from one electrode and a hole injected from the other electrode are combined in the organic emission layer to create excitons, and the excitons emit light by converting the energy of the excitons.

The organic light emitting display includes a plurality of pixels including an organic light emitting element that is a self-luminous element. Each of the pixels includes a plurality of thin film transistors and one or more capacitors for driving the organic light emitting element.

Due to the recent trend toward larger area, a display device is manufactured with a large-area display panel. As the size of the display panel increases, a voltage drop (IR-drop) of a driving voltage, which is supplied to pixels of the display panel through a driving voltage line, is induced due to a resistance of the driving voltage line that is arranged across the display panel and transmits the driving voltage of the display device. In general, in order to prevent the voltage drop of the driving voltage in the display device, the driving voltage line has a vertical driving voltage line and a horizontal driving voltage line in a mesh structure.

For example, the voltage drop of the driving voltage of the display panel causes non-uniformity in luminance and color coordinate deviation of each color due to different luminous efficiency characteristics according to color pixels such as red, green, and blue pixels.

In general, the display device is operated by an analog driving method or a digital driving method. However, in the case of the digital driving method, crosstalk may occur due to the voltage drop occurring in the driving voltage line. In particular, as the size of the display panel increases, an occurrence of crosstalk may be increased by the voltage drop of the driving voltage caused by the resistance of the driving voltage line.

The above information disclosed in this Background section is only for understanding of the background of the inventive concepts, and, therefore, it may contain information that does not constitute prior art.

SUMMARY

Applicant realized that as the size of a display panel of a display device increases, the display panel has non-uniformity in luminance and color coordinate deviation due to an occurrence of crosstalk caused by a voltage drop of a driving voltage due to a resistance of a driving voltage line, through which the driving voltage is supplied to a plurality of pixels of the display panel.

Display devices constructed according to the principles of the invention are capable of reducing an occurrence of crosstalk by reducing a voltage drop of a driving voltage due to resistances of driving voltage lines. Further, in display devices constructed according to the principles of the invention, the number of first common voltage lines extending in a first direction and applying a common voltage may be greater than the number of first driving voltage lines extending in the first direction and applying a driving voltage. Accordingly, an occurrence of crosstalk due to a coupling phenomenon between common voltage lines and data lines may be reduced.

Additional features of the inventive concepts will be set forth in the description which follows, and in part will be apparent from the description, or may be learned by practice of the inventive concepts.

According to an aspect of the invention, a display device includes: a plurality of pixels disposed in a display area; a plurality of first voltage lines electrically connected to the plurality of pixels, the plurality of first voltage lines including a plurality of first common voltage lines extending in a first direction and a plurality of second common voltage lines extending in a second direction intersecting the first direction; and a plurality of second voltage lines electrically connected to the pixels, the plurality of second voltage lines including a plurality of first driving voltage lines extending in the first direction and a plurality of second driving voltage lines extending in the second direction, wherein a number of the first common voltage lines are greater than a number of the first driving voltage lines.

A ratio of the number of the first common voltage lines to the number of the first driving voltage lines may be 2:1.

A ratio of the number of the first common voltage lines to the number of the first driving voltage lines may be 3:1.

The plurality of pixels may include: an active layer; a gate insulating layer covering the active layer; a gate electrode disposed on the gate insulating layer; an interlayer insulating layer covering the gate electrode; a drain pattern disposed on the interlayer insulating layer and electrically connected to the active layer; a first via layer disposed on the drain pattern; a second via layer disposed on the first via layer; and an organic light emitting element disposed on the second via layer.

The plurality of pixels may further include a connection pattern disposed on the drain pattern, wherein the connection pattern may be electrically connected to the drain pattern and the organic light emitting element.

The second common voltage lines and the second driving voltage lines may be disposed in a same layer, in which the drain pattern may be disposed.

The first common voltage lines and the first driving voltage lines may be disposed in a same layer, in which the connection pattern is disposed.

The display device may further include data lines electrically connected to the plurality of pixels and extending in the second direction.

The data lines may be disposed in a same layer, in which the second common voltage lines and the second driving voltage lines may be disposed.

The first common voltage lines and the second common voltage lines may be electrically connected to each other through a contact hole passing through the first via layer.

The first driving voltage lines and the second driving voltage lines may be electrically connected to each other through a contact hole passing through the first via layer.

The plurality of first voltage lines may include a plurality of common voltage lines for supplying a common voltage to the plurality of pixels, and the plurality of second voltage lines may include a plurality of driving voltage lines for supplying a driving voltage to the plurality of pixels.

According to another aspect of the invention, a display device includes: a plurality of pixels disposed in a display area; a plurality of first voltage lines electrically connected to the plurality of pixels, the plurality of first voltage lines including a plurality of first common voltage lines extending in a first direction and a plurality of second common voltage lines extending in a second direction intersecting the first direction; and a plurality of second voltage lines electrically connected to the plurality of pixels, the plurality of second voltage lines including a plurality of first driving voltage lines extending in the first direction and a plurality of second driving voltage lines extending in the second direction, wherein at least two of the first common voltage lines are disposed between adjacent first driving voltage lines.

The plurality of pixels may include: an active layer; a gate insulating layer covering the active layer; a gate electrode disposed on the gate insulating layer; an interlayer insulating layer covering the gate electrode; a drain pattern disposed on the interlayer insulating layer and electrically connected to the active layer; a first via layer disposed on the drain pattern; a second via layer disposed on the first via layer; and an organic light emitting element disposed on the second via layer.

The plurality of pixels may further include a connection pattern disposed on the drain pattern, wherein the connection pattern may be electrically connected to the drain pattern and the organic light emitting element.

The second common voltage lines and the second driving voltage lines may be disposed in a same layer, in which the drain pattern may be disposed.

The first common voltage lines and the first driving voltage lines may be disposed in a same layer, in which the connection pattern may be disposed.

The first common voltage lines and the second common voltage lines may be electrically connected to each other through a contact hole passing through the first via layer.

The first driving voltage lines and the second driving voltage lines may be electrically connected to each other through a contact hole passing through the first via layer.

The plurality of first voltage lines may include a plurality of common voltage lines for supplying a common voltage to the plurality of pixels, and the plurality of second voltage lines may include a plurality of driving voltage lines for supplying a driving voltage to the plurality of pixels.

A display device according to embodiments, the number of first common voltage lines extending in a first direction and applying a common voltage may be greater than the number of first driving voltage lines extending in the first direction and applying a driving voltage. Accordingly, an occurrence of crosstalk due to a coupling phenomenon between common voltage lines and data lines may be reduced.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices in accordance with embodiments will be explained in detail with reference to the accompanying drawings.

Figure 1:
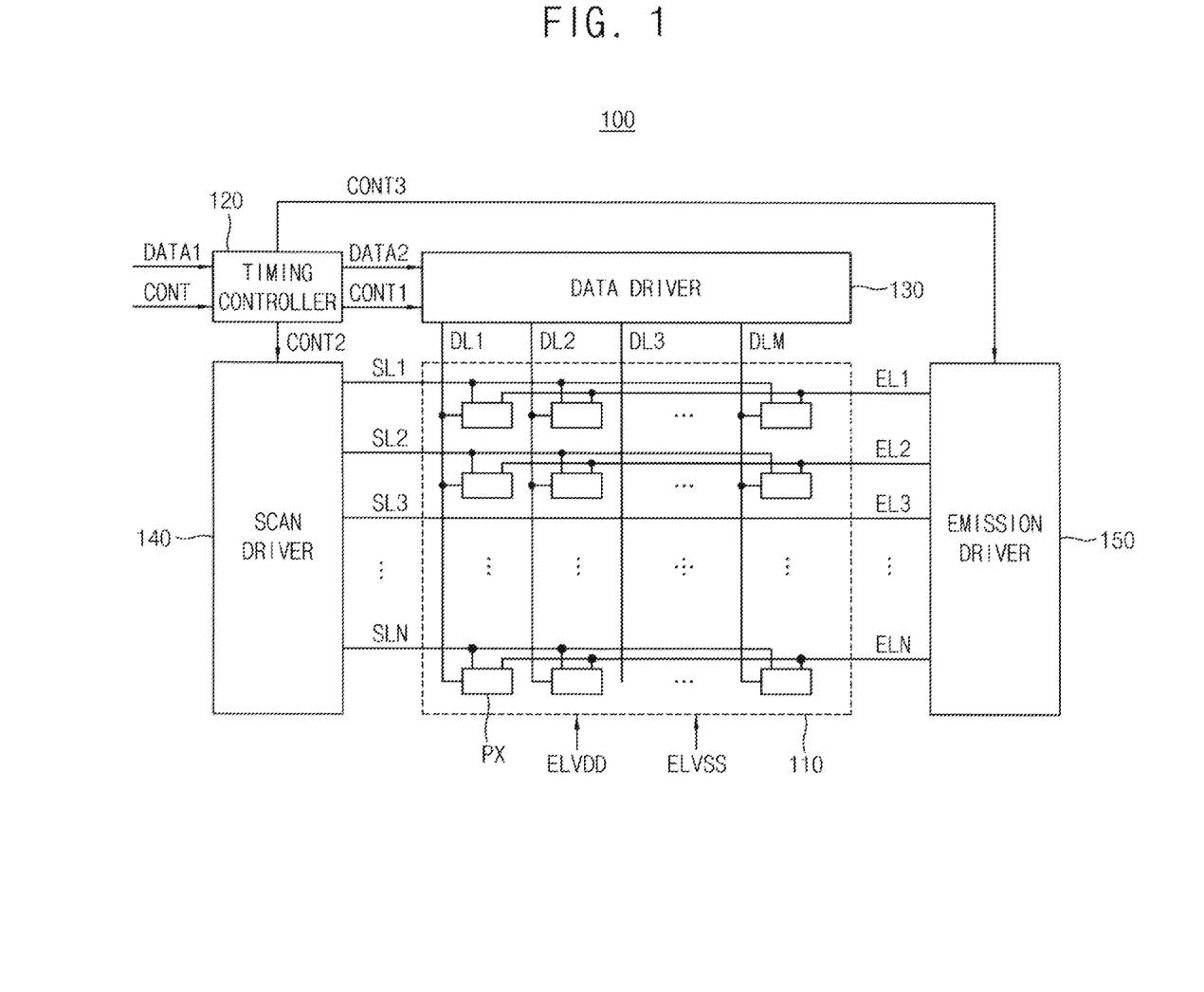
FIG. 1 is a plan view of an embodiment of a display device constructed according to the principles of the invention.

FIG. 1 is a plan view of an embodiment of a display device constructed according to the principles of the invention.

Referring to FIG. 1, the display device 100 may include a display part 110, a timing controller 120, a data driver 130, a scan driver 140, and an emission driver 150.

The display part 110 may include a plurality of pixels PX. For example, the plurality of pixels PX may be disposed in a display area of the display device 100. The plurality of pixels PX may include a plurality of scan lines SL1, SL2, SL3, . . . , SLN, a plurality of data lines DL1, DL2, DL3, . . . , DLM, and a plurality of emission control lines EL1, EL2, EL3, . . . , ELN (wherein, N and M are natural numbers greater than 1).

The data lines DL1, DL2, DL3, . . . , DLM may be connected to the data driver 130 to transmit data voltages to the pixels PX. The scan lines SL1, SL2, SL3, . . . , SLN may be connected to the scan driver 140 to transmit scan signals to the pixels PX. The emission control lines EL1, EL2, EL3, . . . , ELN may be connected to the emission driver 150 to transmit emission control signals to the pixels PX.

Each of the pixels PX may receive a driving voltage ELVDD and a common voltage ELVSS. Each of the pixels PX may receive a corresponding data voltage in response to a corresponding scan signal and may generate light having a grayscale (or a gray level) corresponding to the corresponding data voltage by using the driving voltage ELVDD and the common voltage ELVSS.

The data driver 130 may convert a second data signal DATA2 into the data voltages in response to a first control signal CONT1 and may output the data voltages to the data lines DL1, DL2, DL3, . . . , DLM.

The scan driver 140 may generate the scan signals in response to a second control signal CONT2.

The emission driver 150 may generate the emission control signals in response to a third control signal CONT3.

The timing controller 120 may receive a first data signal DATA1 and a control signal CONT from an external device. In embodiments, the first data signal DATA1 may include red image data, green image data, and blue image data. The control signal CONT may include a horizontal synchronization signal, a vertical synchronization signal, and a main clock signal.

The timing controller 120 may generate the first control signal CONT1 for driving the data driver 130, the second control signal CONT2 for driving the scan driver 140, and the third control signal CONT3 for driving the emission driver 150 based on the control signal CONT.

Figure 2:
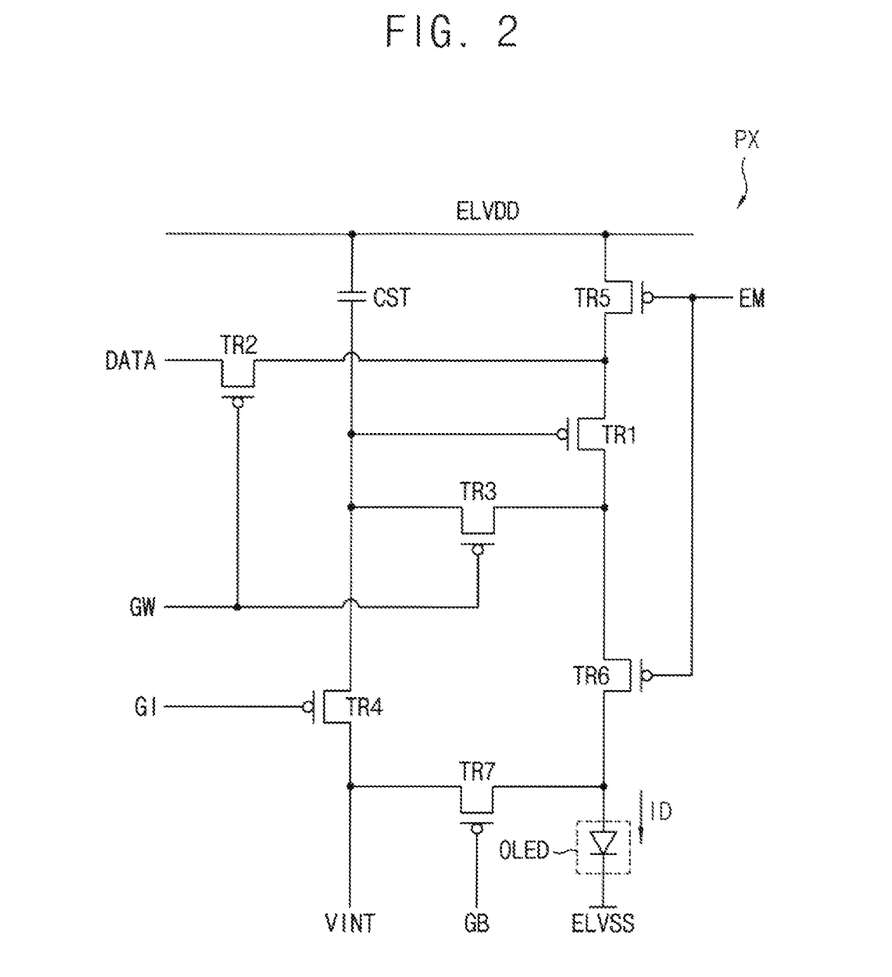
FIG. 2 is a schematic view of a circuit diagram of a representative pixel in the display device of FIG. 1.

FIG. 2 is a schematic view of a circuit diagram of each pixel of FIG. 1

Referring to FIG. 2, each of the pixels PX may include an organic light emitting element OLED, first to seventh transistors TR1, TR2, TR3, TR4, TRS, TR6, and TR7, a storage capacitor CST, a driving voltage line for supplying the driving voltage ELVDD, a first voltage line in the form of a common voltage line for supplying the common voltage ELVSS, an initialization voltage line for supplying the initialization voltage VINT, a second voltage line in the form of a data voltage line for supplying the data voltage DATA, a scan signal line for supplying the scan signal GW, a scan initialization signal line for supplying the scan initialization signal GI, an emission control signal line for supplying the emission control signal EM, a diode initialization signal line for supplying the diode initialization signal GB.

The first transistor TR1 may be a driving transistor and the second to seventh transistors TR2, TR3, TR4, TR5, TR6, and TR7 may be switching transistors. Each of the first to seventh transistors TR1, TR2, TR3, TR4, TR5, TR6, and TR7 may include a first terminal, a second terminal, a channel region, and a gate terminal. According to an embodiment, the first terminal may be a source terminal, and the second terminal may be a drain terminal. Alternatively, the first terminal may be a drain terminal, and the second terminal may be a source terminal.

The organic light emitting element OLED may emit light based on a driving current ID. The organic light emitting element OLED may include a first terminal and a second terminal. According to an embodiment, the second terminal of the organic light emitting element OLED may receive the common voltage ELVSS, and the first terminal of the organic light emitting element OLED may receive the driving voltage ELVDD. For example, the first terminal of the organic light emitting element OLED may be an anode terminal, and the second terminal of the organic light emitting element OLED may be a cathode terminal. Alternatively, the first terminal of the organic light emitting element OLED may be a cathode terminal, and the second terminal of the organic light emitting element OLED may be an anode terminal.

The first transistor TR1 may generate the driving current ID. According to an embodiment, the first transistor TR1 may operate in a saturation region. In this case, the first transistor TR1 may generate the driving current ID based on a voltage difference between the gate terminal and the source terminal of the first transistor TR1. In addition, a gray level (or a grayscale value) may be expressed based on a magnitude of the driving current ID supplied to the organic light emitting element OLED. Alternatively, the first transistor TR1 may operate in a linear region. In this case, the gray level may be expressed based on the sum of time that the driving current ID is supplied to the organic light emitting element OLED within one frame.

The gate terminal of the second transistor TR2 may receive the scan signal GW. The first terminal of the second transistor TR2 may receive the data voltage DATA. The second terminal of the second transistor TR2 may be connected to the first terminal of the first transistor TR1. For example, the scan signal GW may be provided from the scan driver 140 shown in FIG. 1, and the scan signal GW may be transmitted to the gate terminal of the second transistor TR2 through the scan signal line for supplying the scan signal GW. The second transistor TR2 may supply the data voltage DATA to the first terminal of the first transistor TR1 during an activation period of the scan signal GW (e.g., a turn-on period).

The gate terminal of the third transistor TR3 may receive the scan signal GW. The first terminal of the third transistor TR3 may be connected to the gate terminal of the first transistor TR1. The second terminal of the third transistor TR3 may be connected to the second terminal of the first transistor TR1. For example, the scan signal GW may be provided from the scan driver 140 shown in FIG. 1, and the scan signal GW may be transmitted to the gate terminal of the third transistor TR3 through the scan signal line for supplying the scan signal GW. The third transistor TR3 may connect the gate terminal of the first transistor TR1 and the second terminal of the first transistor TR1 during an activation period of the scan signal GW.

An input terminal of the initialization voltage line for supplying the initialization voltage VINT may be connected to the first terminal of the fourth transistor TR4 and the first terminal of the seventh transistor TR7.

An input terminal of the initialization voltage line, to which the initialization voltage VINT, is provided may be connected to the first terminal of the fourth transistor TR4 and the first terminal of the seventh transistor TR7, and an output terminal of the initialization voltage line may be connected to the second terminal of the fourth transistor TR4 and the first terminal of the storage capacitor CST.

The gate terminal of the fourth transistor TR4 may receive the scan initialization signal GI. The first terminal of the fourth transistor TR4 may receive the initialization voltage VINT. The second terminal of the fourth transistor TR4 may be connected to the gate terminal of the first transistor TR1. The fourth transistor TR4 may supply the initialization voltage VINT to the gate terminal of the first transistor TR1 during an activation period of the scan initialization signal GI. In this case, the fourth transistor TR4 may operate in a linear region. For example, the fourth transistor TR4 may initialize the gate terminal of the first transistor TR1 to the initialization voltage VINT during an activation period of the scan initialization signal GI (e.g., a turn-on period).

The gate terminal of the fifth transistor TR5 may receive the emission control signal EM. The first terminal of the fifth transistor TR5 may be connected to the driving voltage line for supplying the driving voltage ELVDD. The second terminal of the fifth transistor TR5 may be connected to the first terminal of the first transistor TR1. For example, the light emission control signal EM may be provided from the emission driver 150 shown in FIG. 1 and the light emission control signal EM may be transmitted from the fifth transistor TR5 through the emission control signal line for supplying the emission control signal EM. The fifth transistor TR5 may supply the driving voltage ELVDD to the first terminal of the first transistor TR1 during an activation period of the emission control signal EM (e.g., a turn-on period). Conversely, the fifth transistor TR5 may block the supply of the driving voltage ELVDD during an inactive period of the emission control signal EM (e.g., a turn-off period). In this case, the fifth transistor TR5 may operate in a linear region. The fifth transistor TR5 may supply the driving voltage ELVDD to the first terminal of the first transistor TR1 during the activation period of the emission control signal EM, so that the first transistor TR1 may supply the driving current ID. In addition, the fifth transistor TR5 may block the supply of the driving voltage ELVDD during the inactive period of the emission control signal EM, so that the data voltage DATA is supplied to the first terminal of the first transistor TR1. In addition, the fifth transistor TR5 may block the supply of the driving voltage ELVDD during an inactive period of the emission control signal EM, so that the data voltage DATA supplied to the first terminal of the first transistor TR1 may be supplied to the gate terminal of the first transistor TR1.

The gate terminal of the sixth transistor TR6 may receive the emission control signal EM. The first terminal of the sixth transistor TR6 may be connected to the second terminal of the first transistor TR1. The second terminal of the sixth transistor TR6 may be connected to the first terminal of the organic light emitting element OLED. The sixth transistor TR6 may supply the driving current ID generated by the first transistor TR1 to the organic light emitting element OLED during an activation period of the emission control signal EM. In this case, the sixth transistor TR6 may operate in a linear region. For example, the sixth transistor TR6 may supply the driving current ID generated by the first transistor TR1 to the organic light emitting element OLED during an activation period of the emission control signal EM, so that the organic light emitting element OLED may output light. In addition, the sixth transistor TR6 may electrically separate the first transistor TR1 and the organic light emitting element OLED from each other during an inactive period of the emission control signal EM, so that the supplied data voltage DATA supplied to the second terminal of the first transistor TR1 may be supplied to the gate terminal of the first transistor TR1.

The gate terminal of the seventh transistor TR7 may receive the diode initialization signal GB. The first terminal of the seventh transistor TR7 may receive the initialization voltage VINT. The second terminal of the seventh transistor TR7 may be connected to the first terminal of the organic light emitting element OLED. The seventh transistor TR7 may supply the initialization voltage VINT to the first terminal of the organic light emitting element OLED during an activation period of the diode initialization signal GB. In this case, the seventh transistor TR7 may operate in a linear region. For example, the seventh transistor TR7 may initialize the first terminal of the organic light emitting element OLED to the initialization voltage VINT during an activation period of the diode initialization signal GB. Alternatively, the gate initialization signal GI and the diode initialization signal GB may be the substantially same signal.

The storage capacitor CST may include a first terminal and a second terminal. The storage capacitor CST may be connected between the driving voltage line for supplying the driving voltage ELVDD and the gate terminal of the first transistor TR1. For example, the first terminal of the storage capacitor CST may be connected to the gate terminal of the first transistor TR1, and the second terminal of the storage capacitor CST may be connected to the driving voltage line. The storage capacitor CST may maintain a voltage level of the gate terminal of the first transistor TR1 during an inactive period of the scan signal GW (e.g., a turn-off period). The inactivation period of the scan signal GW (e.g., a turn-off period) may include an activation period of the emission control signal EM and during the activation period of the emission control signal EM, the driving current ID generated by the first transistor TR1 may be supplied to the organic light emitting element OLED. Accordingly, the driving current ID generated by the first transistor TR1 based on the voltage level maintained by the storage capacitor CST may be supplied to the organic light emitting element OLED.

However, although that each of the pixels PX includes seven transistors and one storage capacitor has been described, embodiments are not limited thereto. For example, each of the pixels PX may have a configuration including at least one transistor and at least one storage capacitor.

Figure 3:
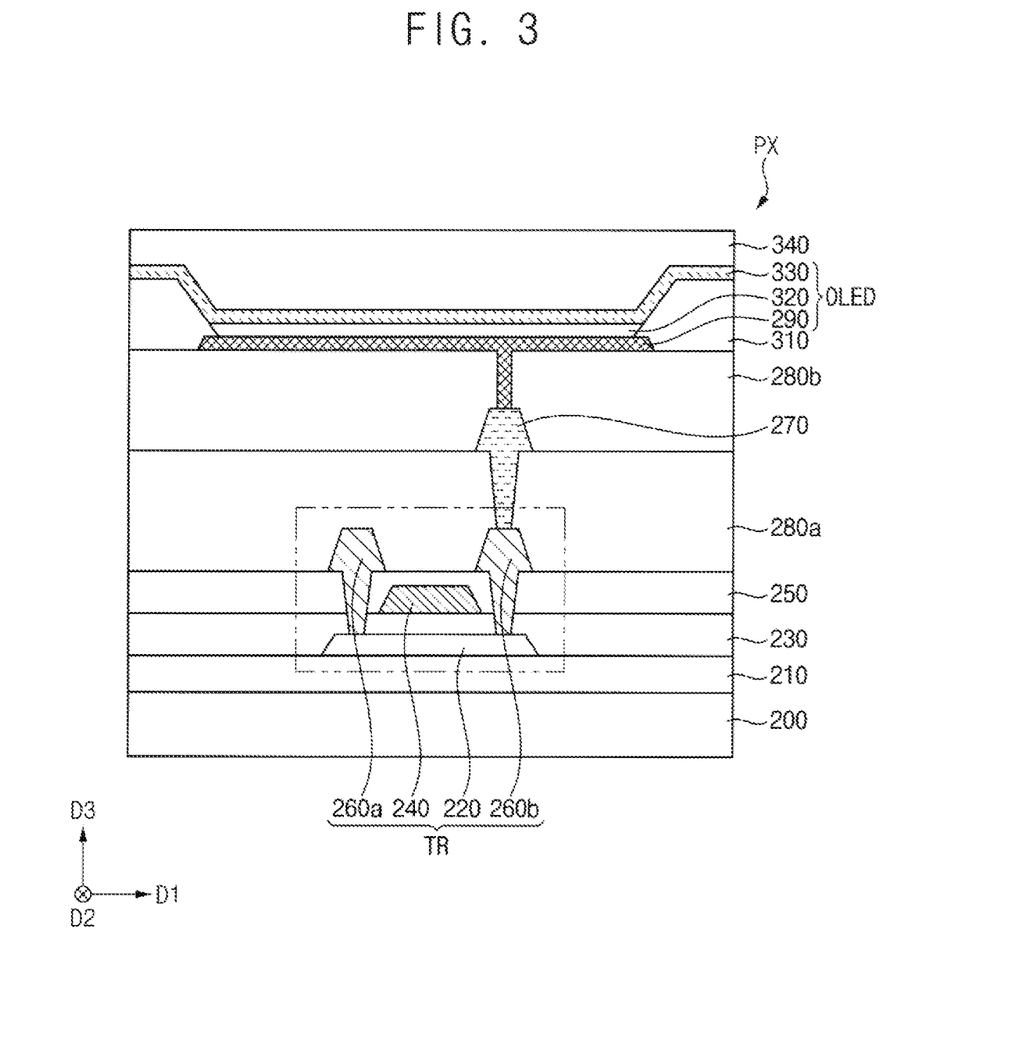
FIG. 3 is a cross-sectional view of the representative pixel in the display device of FIG. 1.

FIG. 3 is a cross-sectional view illustrating each pixel of a display device according to an embodiment.

Referring to FIG. 3, each of pixels PX included in the display device 100 may include a substrate 200, a buffer layer 210, a transistor TR, a gate insulating layer 230, an interlayer insulating layer 250, a first via layer 280a, a second via layer 280b, a connection pattern 270, a pixel defining layer 310, an organic light emitting element OLED, an encapsulation layer 340, and the like.

The organic light emitting element OLED may include a lower electrode 290, an emission layer 320, and an upper electrode 330. The transistor TR may include an active layer 220, a gate electrode 240, a source pattern 260a, and a drain pattern 260b. According to an embodiment, the transistor TR may include any one of the first to seventh transistors TR1, TR2, TR3, TR4, TR5, TR6, and TR7 shown in FIG. 2.

The substrate 200 may include a transparent or opaque material. For example, the substrate 200 may include a plastic having excellent heat resistance and durability such as polyimide, polyethylene etherphthalate, and the like. Alternatively, the substrate 200 may include various materials such as a glass material or a metal material.

The buffer layer 210 may be disposed on the substrate 200. For example, the buffer layer 210 may include an inorganic material such as oxide or nitride. The buffer layer 210 may prevent diffusion of metal atoms or impurities from the substrate 200 to the thin film transistor TR. In addition, when the surface of the substrate 200 is not uniform, the buffer layer 210 may improve a flatness of a surface of the substrate 200.

The active layer 220 may be disposed on the buffer layer 210. The active layer 220 may include a silicon semiconductor or an oxide semiconductor. For example, the active layer 220 may include a silicon semiconductor containing polysilicon. Alternatively, the active layer 220 may include an oxide semiconductor containing indium (In), zinc (Zn), gallium (Ga), tin (Sn), titanium (Ti), aluminum (Al), hafnium (Hf), zirconium (Zr), magnesium (Mg), and the like.

The active layer 220 may include a channel region, a first region, and a second region. The first region and the second region of the active layer 220 may be respectively positioned on both sides of the channel region. Impurities may be doped into each of the first region and the second region of the active layer 220.

The gate insulating layer 230 may be disposed on the buffer layer 210. The gate insulating layer 230 may cover the active layer 220. For example, the gate insulating layer 230 may include silicon oxide ($SiO_X$), silicon nitride ($SiN_X$), silicon oxynitride ($SiO_XN_Y$), silicon oxycarbide ($SiO_XC_Y$), and the like. Alternatively, the gate insulating layer 230 may include an insulating metal oxide such as aluminum oxide ($AlO_X$), tantalum oxide ($TaO_X$), hafnium oxide ($HfO_X$), zirconium oxide ($ZrO_X$), titanium oxide ($TiO_X$), and the like.

The gate electrode 240 may be disposed on the gate insulating layer 230. The gate electrode 240 may be disposed to overlap the channel region of the active layer 220. For example, the gate electrode 240 may include a metal such as aluminum (Al), silver (Ag), chromium (Cr), titanium (Ti), tantalum (Ta), molybdenum (MO), and the like, alloys thereof, nitrides thereof, a conductive metal oxide, a transparent conductive material, and the like. For example, the gate electrode 240 may have a stacked structure of a titanium film and a molybdenum film.

The interlayer insulating layer 250 may be disposed on the gate insulating layer 230. The interlayer insulating layer 250 may cover the gate electrode 240. For example, the interlayer insulating layer 250 may include silicon oxide, silicon nitride, silicon oxynitride, silicon oxycarbide, and the like.

The source pattern 260*a* and the drain pattern 260*b* may be disposed on the interlayer insulating layer 250. Each of the source pattern 260*a* and the drain pattern 260*b* may be connected to the first region and the second region of the active layer 220 through a contact hole formed by removing a portion of the gate insulating layer 230 and the interlayer insulating layer 250. Accordingly, each of the source pattern 260*a* and the drain pattern 260*b* may be electrically connected to the first region and the second region of the active layer 220. For example, each of the source pattern 260*a* and the drain pattern 260*b* may include a metal, an alloy, a metal nitride, a conductive metal oxide, a transparent conductive material, and the like. According to an embodiment, when the transistor TR is the fifth transistor TR5 shown in FIG. 2, the transistor TR may receive the driving voltage ELVDD through the driving voltage lines 170 shown in FIG. 4.

The first via layer 280*a* may be disposed on the interlayer insulating layer 250. The first via layer 280*a* may cover the source pattern 260*a* and the drain pattern 260*b*. For example, the first via layer 280*a* may include an organic insulating material such as phenol resin, acrylic resin, polyimide resin, polyamide resin, siloxane resin, epoxy resin, and the like.

The connection pattern 270 may be disposed on the first via layer 280*a*. The connection pattern 270 may be electrically connected to the drain pattern 260*b* through a contact hole formed by removing a portion of the first via layer 280*a*. For example, the connection pattern 270 may include a metal, an alloy, a metal nitride, a conductive metal oxide, a transparent conductive material, and the like.

The second via layer 280*b* covering the connection pattern 270 may be disposed on the first via layer 280*a*. For example, the second via layer 280*b* may include an organic insulating material such as phenol resin, acrylic resin, polyimide resin, polyamide resin, siloxane resin, epoxy resin, and the like.

The lower electrode 290 may be disposed on the second via layer 280*b*. The lower electrode 290 may be electrically connected to the connection pattern through a contact hole formed by removing a portion of the second via layer 280*b*. For example, the lower electrode 290 may include a metal, an alloy, a metal nitride, a conductive metal oxide, a transparent conductive material, and the like. The lower electrode 290 may be defined as an anode electrode.

The pixel defining layer 310 may be disposed on the second via layer 280*b* and the lower electrode 290. The pixel defining layer 310 may have an opening exposing at least a portion of the lower electrode 290. For example, the pixel defining layer 310 may include an organic insulating material. For example, the pixel defining layer 310 may include resins such as polyacrylic, polyimide, and the like.

The emission layer 320 may be disposed on the lower electrode 290. The emission layer 320 may include a hole injection layer, a hole transport layer, an organic emission layer, an electron transport layer, an electron injection layer, and the like. For example, the emission layer 320 may include a low molecular weight organic compound or a high molecular weight organic compound.

The upper electrode 330 may be disposed on the pixel defining layer 310 and the emission layer 320. The upper electrode 330 may entirely cover the pixel defining layer 310 and the emission layer 320. The upper electrode 330 may continuously extend on the display part 110 shown in FIG. 1. The upper electrode 330 may be defined as a cathode electrode. Alternatively, the upper electrode 330 may partially cover the pixel defining layer 310 and the emission layer 320. According to an embodiment, the upper electrode 330 of the organic light emitting element OLED may receive the common voltage ELVSS through the common voltage lines 160 shown in FIG. 4.

The encapsulation layer 340 may be disposed on the upper electrode 330. For example, the encapsulation layer 340 may have a stacked structure of an inorganic thin film and an organic thin film. The encapsulation layer 340 may prevent the organic light emitting element OLED from being deteriorated or contaminated due to penetration of moisture or oxygen. In addition, the encapsulation layer 340 may also perform a function of protecting the organic light emitting element OLED from external impact.

For example, the organic thin film may include a cured polymer such as polyacrylate, epoxy resin, silicone resin, and the like. For example, the inorganic thin film may include silicon oxide, silicon nitride, silicon carbide, aluminum oxide, tantalum oxide, hafnium oxide, zirconium oxide, titanium oxide, and the like.

Figure 4:
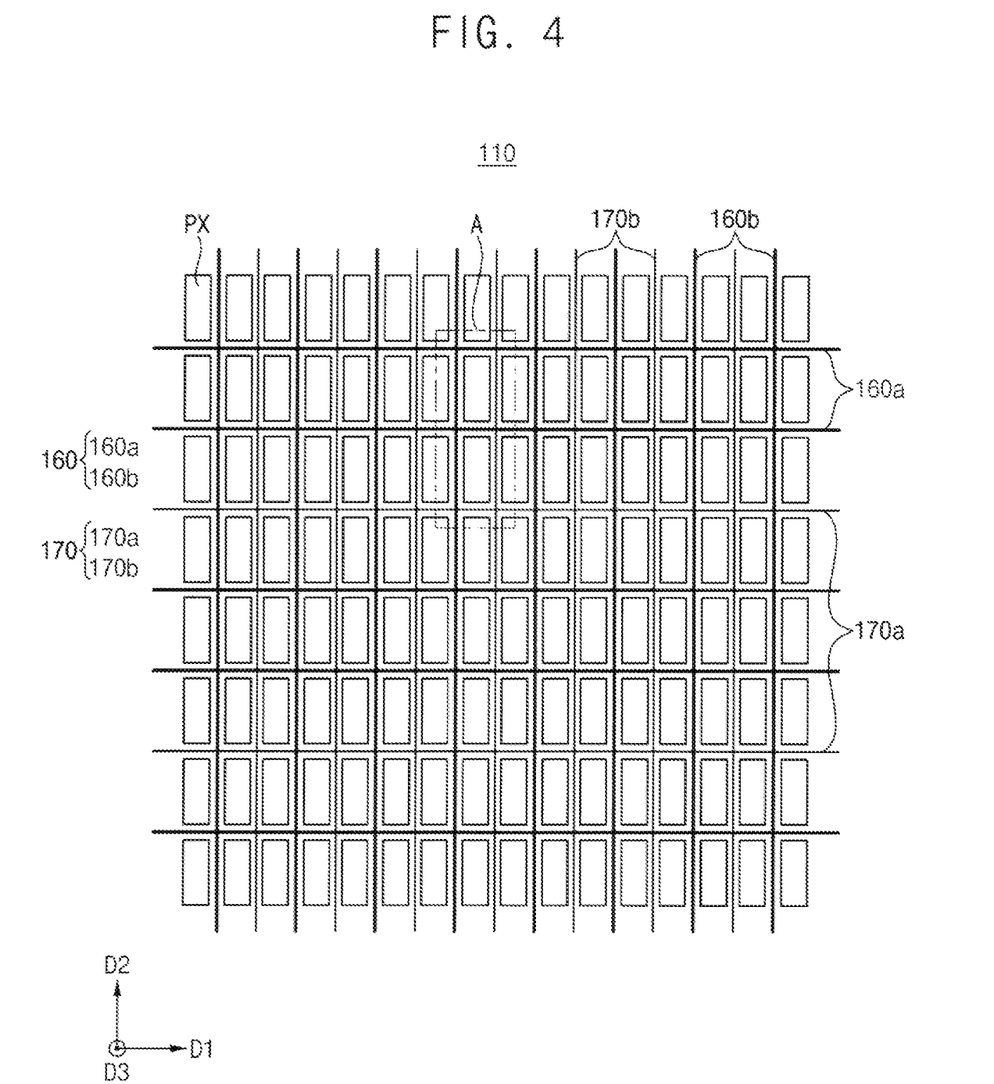
FIG. 4 is a plan view of an embodiment of a display part of the display device of FIG. 1
Figure 5:
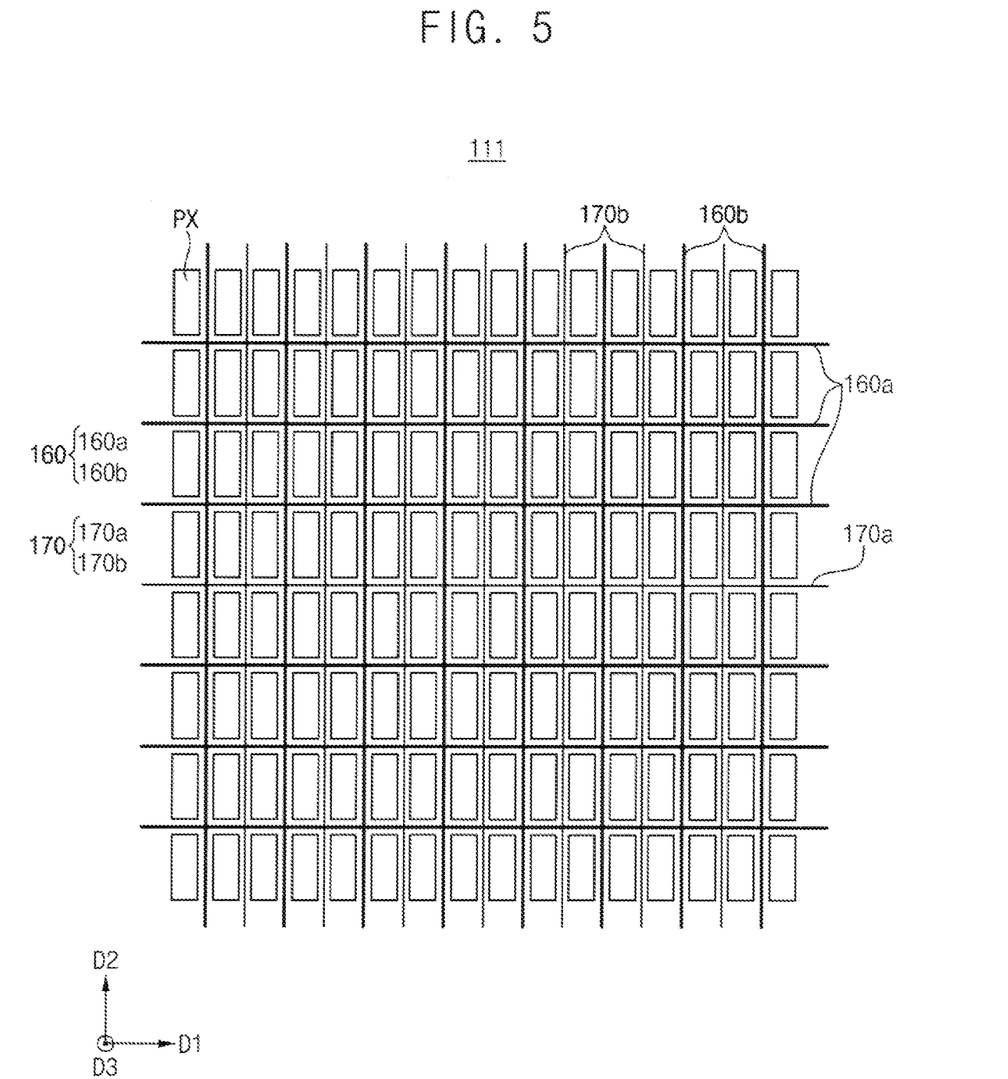
FIG. 5 is a plan view of another embodiment of a display part of the display device of FIG. 1.

FIG. 4 is a plan view of an embodiment of a display part of the display device of FIG. 1. FIG. 5 is a plan view of another embodiment of a display part of a display device according to an embodiment.

Referring to 4 and 5, each of the display part 110 shown in FIG. 4 and the display part 111 shown in FIG. 5 may include a plurality of pixels PX, a plurality of first common voltage lines 160*a*, a plurality of second common voltage lines 160*b*, a plurality of first driving voltage lines 170*a*, a plurality of second driving voltage lines 170*b*, and the like.

According to an embodiment, the first common voltage lines 160*a* may extend in a first direction D1 (e.g., in a row direction) and may be electrically connected to each of the pixels PX. The second common voltage lines 160*b* may extend in a second direction D2 (e.g., in a column direction) intersecting the first direction D1 and may be electrically connected to each of the pixels PX. Also, the second common voltage lines 160*b* may be electrically connected to the first common voltage lines 160*a*. For example, the common voltage line 160 may include the first common voltage lines 160*a* and second common voltage lines 160*b* that are formed in a mesh structure. The common voltage lines 160 may apply a common voltage ELVSS to the organic light emitting element OLED shown in FIG. 2. The common voltage ELVSS should have a constant voltage. Accordingly, the common voltage ELVSS may be applied to the organic light emitting element OLED through the first common voltage lines 160*a* and the second common voltage lines 160*b* such that the organic light emitting element OLED may receive a constant voltage.

According to an embodiment, the second common voltage lines 160*b* may be disposed in the same layer (e.g., the first via layer 280*a*), in which the source pattern 260*a* and the drain pattern 260*b* shown in FIG. 3 are disposed, and the first common voltage lines 160*a* may be disposed in the same layer (e.g., the second via layer 280*b*), in which the connection pattern 270 shown in FIG. 3 is disposed. For example, the second common voltage lines 160*b*, the source pattern 260a, and the drain pattern 260b may horizontally overlap each other in the same layer (e.g., the first via layer 280a), and the first common voltage lines 160a and the connection pattern 270 may horizontally overlap each other in the same layer (e.g., the second via layer 280b).

Alternatively, the second common voltage lines 160b may be disposed in the same layer (e.g., the second via layer 280b), in which the connection pattern 270 shown in FIG. 3 is disposed, and the first common voltage lines 160a may be disposed in the same layer (e.g., the first via layer 280a), in which the source pattern 260a and the drain pattern 260b shown in FIG. 3 are disposed. For example, the second common voltage lines 160b, the source pattern 260a, and the drain pattern 260b may horizontally overlap each other in the same layer (e.g., the second via layer 280b), and the first common voltage lines 160a and the connection pattern 270 may horizontally overlap each other in the same layer (e.g., the first via layer 280a).

According to an embodiment, the first driving voltage lines 170a may extend in the first direction D1 and may be electrically connected to each of the pixels PX. The second driving voltage lines 170b may extend in a second direction D2 intersecting the first direction D1 and may be electrically connected to each of the pixels PX. In addition, the second driving voltage lines 170b may be electrically connected to the first driving voltage lines 170a. For example, the driving voltage lines 170 may include the first driving voltage lines 170a and the second driving voltage lines 170b formed in a mesh structure. The driving voltage lines 170 may apply the driving voltage ELVDD to the fifth transistor TR5 shown in FIG. 2. The driving voltage ELVDD should have a constant voltage. Accordingly, the driving voltage may be applied to the fifth transistor TR5 through the first driving voltage lines 170a and the second driving voltage lines 170b such that the fifth transistor TR5 may receive a constant voltage.

According to an embodiment, the second driving voltage lines 170b may be disposed in the same layer (e.g., the first via layer 280a), in which the source pattern 260a and the drain pattern 260b shown in FIG. 3 are disposed, and the first driving voltage lines 170a may be disposed in the same layer (e.g., the second via layer 280b), in which the connection pattern 270 shown in FIG. 3 is disposed. For example, the second driving voltage lines 170b, the source pattern 260a, and the drain pattern 260b may horizontally overlap each other in the same layer (e.g., the first via layer 280a), and the first driving voltage lines 170a and the connection pattern 270 may horizontally overlap each other in the same layer (e.g., the second via layer 280b).

Alternatively, the second driving voltage lines 170b may be disposed in the same layer (e.g., the second via layer 280b), in which the connection pattern 270 shown in FIG. 3 is disposed, and the first driving voltage lines 170a may be disposed in the same layer (e.g., the first via layer 280a), in which the source pattern 260a and the drain pattern 260b shown in shown in FIG. 3 are disposed. For example, the second driving voltage lines 170b, the source pattern 260a, and the drain pattern 260b may horizontally overlap each other in the same layer (e.g., the second via layer 280b), and the first driving voltage lines 170a and the connection pattern 270 may horizontally overlap each other in the same layer (e.g., the first via layer 280a).

According to an embodiment, the number of the first common voltage lines 160a may be greater than the number of the first driving voltage lines 170a. For example, as shown in FIG. 4, a ratio of the number of the first common voltage lines 160a to the number of the first driving voltage lines 170a may be 2:1. For example, as shown in FIG. 5, a ratio of the number of the first common voltage lines 160a to the number of the first driving voltage lines 170a may be 3:1. However, embodiments are not limited thereto. For example, a ratio of the number of the first common voltage lines 160a to the number of the first driving voltage lines 170a may be N:1 (wherein, N is a natural number greater than 1).

According to an embodiment, at least two of the first common voltage lines 160a may be disposed between the adjacent first driving voltage lines 170a. For example, as shown in FIG. 4, the two first common voltage lines 160a may be disposed between the adjacent first driving voltage lines 170a. For example, as shown in FIG. 4, the three first common voltage lines 160a may be disposed between the adjacent first driving voltage lines 170a.

In the display device 100 according to an embodiment, the common voltage lines 160 and the driving voltage lines 170 may be arranged in a mesh structure and the number of the first common voltage lines 160a may be greater than the number of the first driving voltage lines 170a. Accordingly, resistance of the common voltage lines 160 may be lowered and crosstalk may be reduced.

Figure 6:
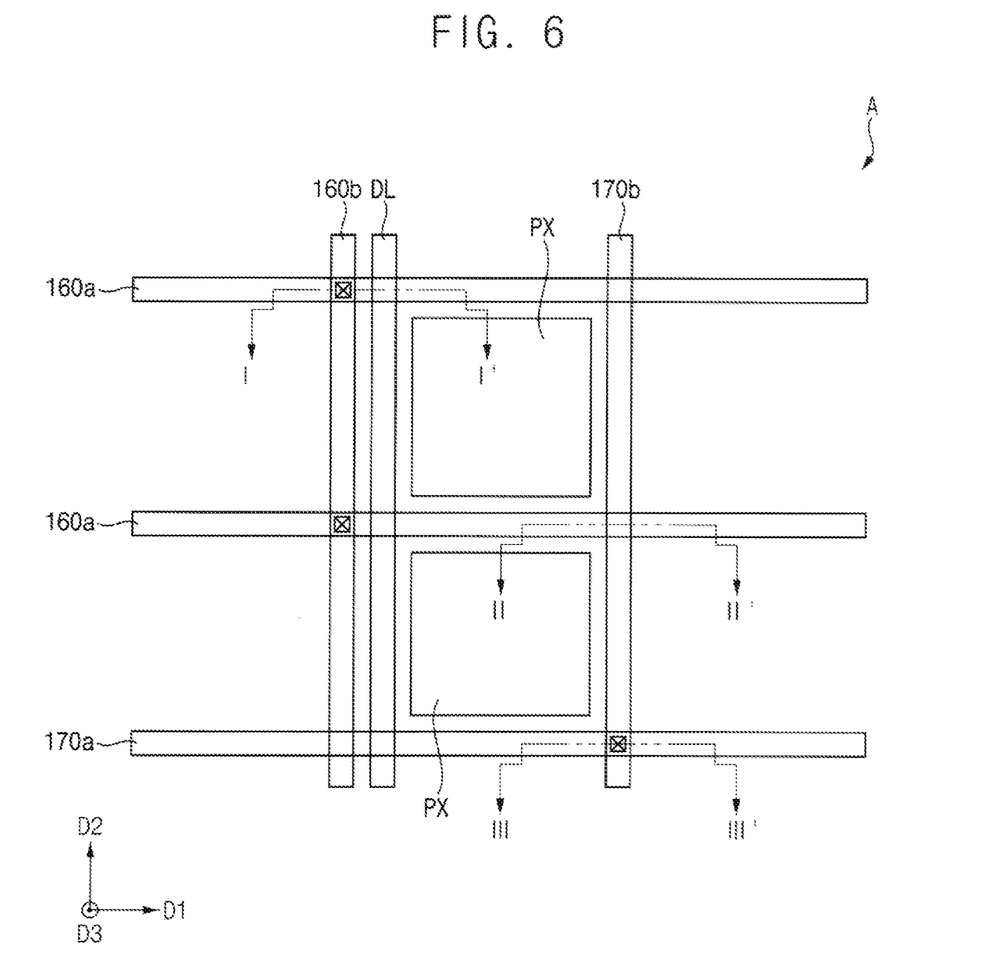
FIG. 6 is an enlarged view of area "A" of FIG. 4.
Figure 7:
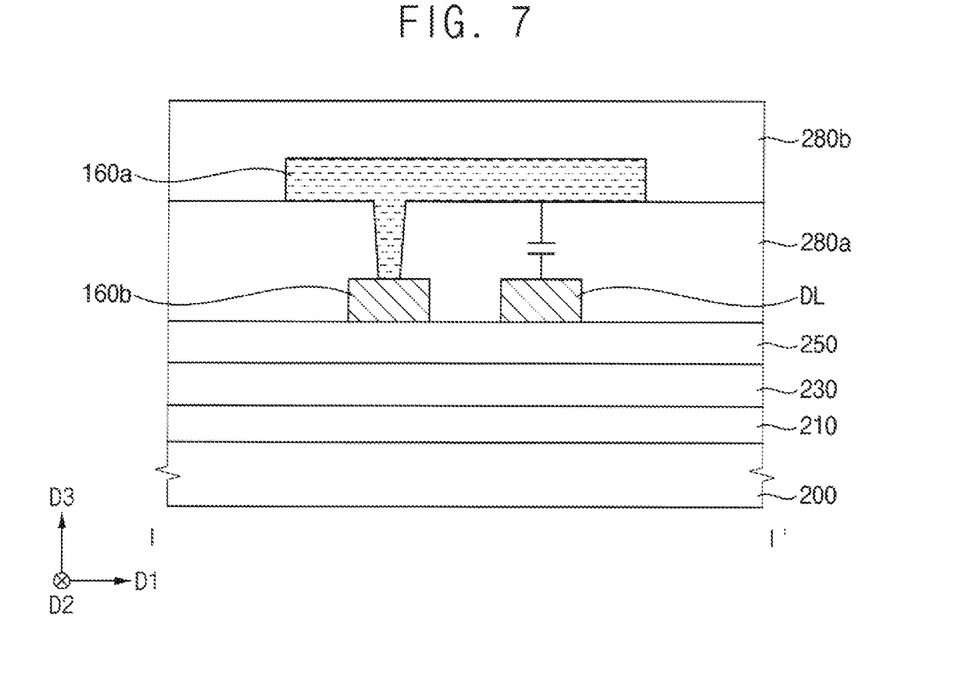
FIG. 7 is a cross-sectional view taken along the line I-I' of FIG. 6.

FIG. 6 is a plan view showing an enlarged view of area "A" of FIG. 4. FIG. 7 is a cross-sectional view of the display device of FIG. 6 taken along the line I-I'.

Referring to FIG. 6, the first common voltage lines 160a and the first driving voltage lines 170a, which are electrically connected to each of the pixels PX, may extend in a first direction Dl. The second common voltage lines 160b, the second driving voltage lines 170b, and the data lines DL, which are electrically connected to each of the pixels PX, may extend in a second direction D2 intersecting the first direction D1.

Referring to FIG. 7, the display device 100 may include a substrate 200, a buffer layer 210, a gate insulating layer 230, an interlayer insulating layer 250, a first via layer 280a, a second via layer 280b, a first common voltage line 160a, a second common voltage line 160b, a data line DL, and the like.

The second common voltage line 160b and the data line DL may be disposed on the interlayer insulating layer 250. For example, the second common voltage line 160b and the data line DL may be disposed in the same layer, in which the source pattern 260a and the drain pattern 260b shown in FIG. 3 are disposed. For example, the second common voltage line 160b, the data line DL, the source pattern 260a, and the drain pattern 260b may include a same metal. For example, the second common voltage line 160b, the data line DL, the source pattern 260a, and the drain pattern 260b may be formed of the same metal.

The first via layer 280a may be disposed on the interlayer insulating layer 250, and the first common voltage line 160a may be disposed on the first via layer 280a. For example, the first common voltage line 160a may be disposed in the same layer, in which the connection pattern 270 shown in FIG. 3 is disposed. For example, the first common voltage line 160a and the connection pattern 270 may include a same metal. For example, the first common voltage line 160a and the connection pattern 270 may be formed of the same metal. The first common voltage line 160a may overlap the second common voltage line 160b and the data line DL.

According to an embodiment, the first common voltage line 160a may be electrically connected to the second common voltage line 160b through a contact hole formed by removing a portion of the first via layer 280a.

According to an embodiment, the first common voltage line 160a and the second common voltage line 160b may be electrically connected to each other through a contact hole passing through the first via layer 280a.

Due to a parasitic capacitor formed between the first common voltage line 160a and the data line DL, a coupling phenomenon occurs between the first common voltage line 160a and the data line DL through the parasitic capacitor formed therebetween.

In the display device 100 according to an embodiment, as shown in FIGS. 4 and 5, the common voltage lines 160 and the driving voltage lines 170 may be arranged in a mesh structure, and the first common voltage lines 160a may be greater than the number of the first driving voltage lines 170a. Accordingly, an occurrence of crosstalk due to the coupling phenomenon may be reduced.

Figure 8:
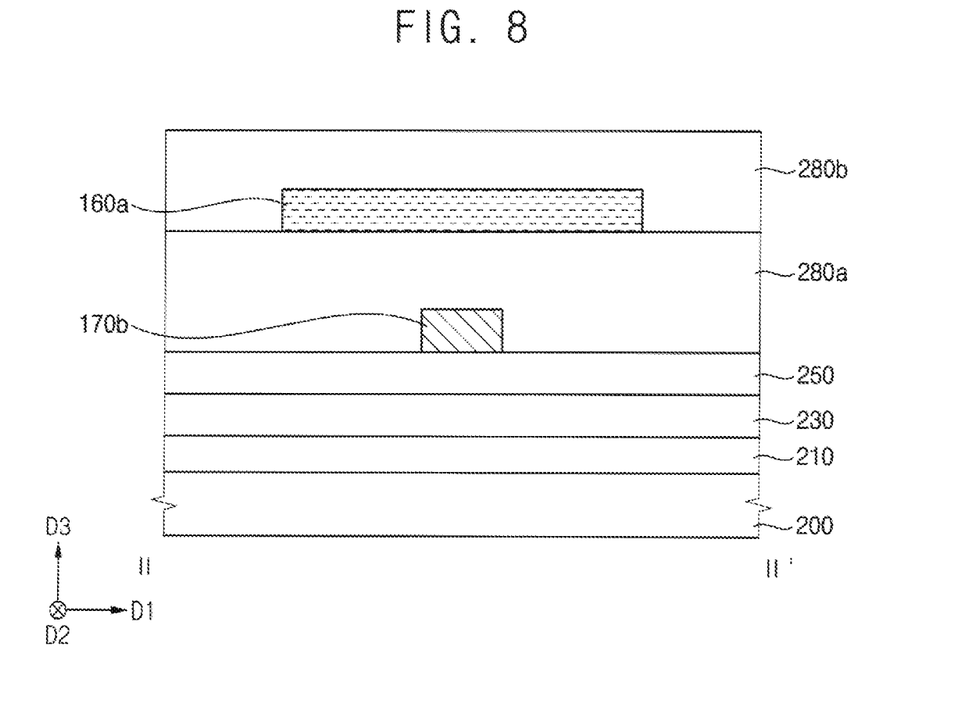
FIG. 8 is a cross-sectional view taken along the line II-II' of FIG. 6.
Figure 9:
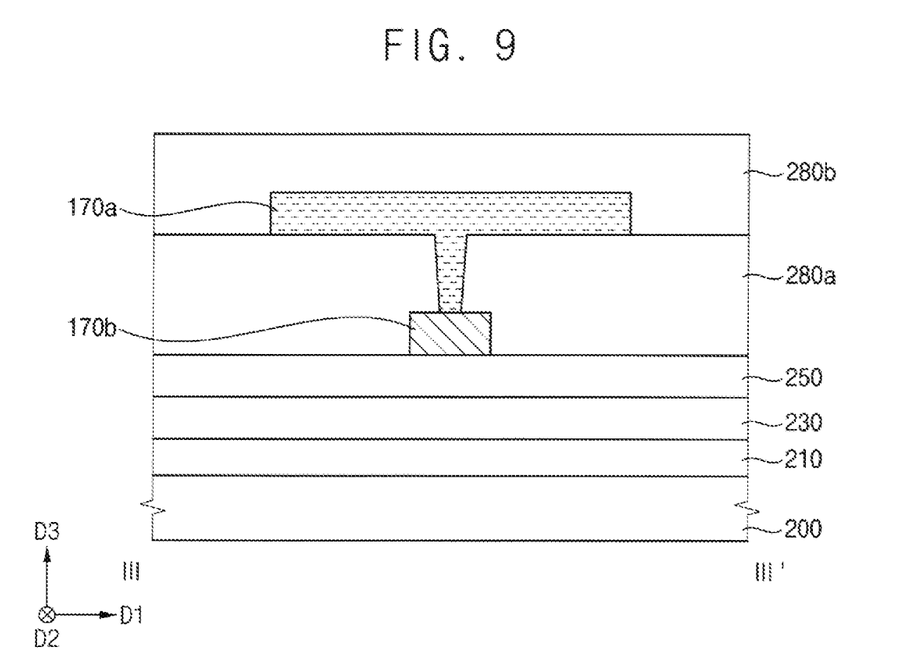
FIG. 9 is a cross-sectional view taken along the line of FIG. 6.

FIG. 8 is a cross-sectional view of the display device of FIG. 6 taken along the line II-II'. FIG. 9 is a cross-sectional view of the display device of FIG. 6 taken along the line III-III'.

Referring to FIG. 8, the display device 100 may include the substrate 200, the buffer layer 210, the gate insulating layer 230, the interlayer insulating layer 250, the first via layer 280a, the second via layer 280b, the first common voltage line 160a, the second driving voltage line 170b, and the like.

The second driving voltage line 170b may be disposed on the interlayer insulating layer 250. For example, the second driving voltage line 170b may be disposed in the same layer, in which the source pattern 260a and the drain pattern 260b shown in FIG. 3 are disposed. For example, the second driving voltage line 170b, the source pattern 260a, and the drain pattern 260b may include a same metal. For example, the second driving voltage line 170b, the source pattern 260a, and the drain pattern 260b may be formed of the same metal.

The first via layer 280a may be disposed on the interlayer insulating layer 250, and the first common voltage line 160a may be disposed on the first via layer 280a. For example, the first common voltage line 160a may be disposed in the same layer, in which the connection pattern 270 shown in FIG. 3 is disposed. For example, the first common voltage line 160a and the connection pattern 270 may include a same metal. For example, the first common voltage line 160a and the connection pattern 270 may be formed of the same metal. The first common voltage line 160a may overlap the second driving voltage line 170b. Also, the first common voltage line 160a may not be electrically connected to the second driving voltage line 170b.

Referring to FIG. 9, the display device 100 may include the substrate 200, the buffer layer 210, the gate insulating layer 230, the interlayer insulating layer 250, the first via layer 280a, the second via layer 280b, the first driving voltage line 170a, the second driving voltage line 170b, and the like.

The second driving voltage line 170b may be disposed on the interlayer insulating layer 250. For example, the second driving voltage line 170b may be disposed in the same layer, in which the source pattern 260a and the drain pattern 260b shown in FIG. 3 are disposed. For example, the second driving voltage line 170b, the source pattern 260a, and the drain pattern 260b may include a same metal. For example, the second driving voltage line 170b, the source pattern 260a, and the drain pattern 260b may be formed of the same metal.

The first via layer 280a may be disposed on the interlayer insulating layer 250, and the first driving voltage line 170a may be disposed on the first via layer 280a. For example, the first driving voltage line 170a may be disposed in the same layer, in which the connection pattern 270 illustrated in FIG. 3 is disposed. For example, the first driving voltage line 170a and the connection pattern 270 may include a same metal. For example, the first driving voltage line 170a and the connection pattern 270 may be formed of the same metal. The first driving voltage line 170a may overlap the second driving voltage line 170b.

According to an embodiment, the first driving voltage line 170a and the second driving voltage line 170b may be electrically connected to each other through a contact hole passing through the first via layer 280a.

The illustrative embodiments may be applied to various display devices that may have a display device. For example, the illustrative embodiments are applicable to numerous display devices such as display devices for vehicles, ships and aircraft, portable communication devices, display devices for exhibition or information transmission, medical display devices, and the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a plurality of pixels disposed in a display area containing substantially all the pixels in the display device, each pixel comprising one organic light emitting element and a drain pattern;
    a plurality of first voltage lines electrically connected to the plurality of pixels and that apply a common voltage to the organic emitting element of each pixel, the plurality of first voltage lines comprising a plurality of first common voltage lines extending in a first direction and a plurality of second common voltage lines extending in a second direction intersecting the first direction; and
    a plurality of second voltage lines electrically connected to the pixels and that apply a driving voltage to the organic emitting element of each pixel, the plurality of second voltage lines comprising a plurality of first driving voltage lines extending in the first direction and a plurality of second driving voltage lines extending in the second direction, wherein
    a number of the first common voltage lines is greater than a number of the first driving voltage lines in the display area, and each pixel being immediately surrounded on all sides by at least one of the first and second voltage lines,
    the second common voltage lines and the second driving voltage lines are disposed in a same layer in which the drain pattern is disposed,
    any two of the first driving voltage lines are arranged along the second direction with the first common voltage lines interposed between the any two of the first driving voltage lines, and
    the second common voltage lines and the second driving voltage lines are alternately arranged one by one along the first direction.

2. The display device of claim 1, wherein a ratio of the number of the first common voltage lines to the number of the first driving voltage lines is 2:1.

3. The display device of claim 1, wherein a ratio of the number of the first common voltage lines to the number of the first driving voltage lines is 3:1.

4. The display device of claim 1, wherein
the plurality of pixels further comprise:
- an active layer;
- a gate insulating layer covering the active layer;
- a gate electrode disposed on the gate insulating layer;
- an interlayer insulating layer covering the gate electrode;
- a first via layer disposed on the drain pattern; and
- a second via layer disposed on the first via layer, and
the drain pattern is electrically connected to the active layer.

5. The display device of claim 4, wherein the plurality of pixels further comprise a connection pattern disposed on the drain pattern,
- wherein the connection pattern is electrically connected to the drain pattern and the organic light emitting element.

6. The display device of claim 5, wherein the first common voltage lines and the first driving voltage lines are disposed in a same layer in which the connection pattern is disposed.

7. The display device of claim 1, further comprising data lines electrically connected to the plurality of pixels and extending in the second direction.

8. The display device of claim 7, wherein the data lines are disposed in a same layer, in which the second common voltage lines and the second driving voltage lines are disposed.

9. The display device of claim 4, wherein the first common voltage lines and the second common voltage lines are electrically connected to each other through a contact hole passing through the first via layer.

10. The display device of claim 4, wherein the first driving voltage lines and the second driving voltage lines are electrically connected to each other through a contact hole passing through the first via layer.

11. The display device of claim 1, wherein:
- the plurality of first voltage lines comprise a plurality of common voltage lines for supplying a common voltage to the plurality of pixels, and
- the plurality of second voltage lines comprise a plurality of driving voltage lines for supplying a driving voltage to the plurality of pixels.

12. A display device comprising:
- a plurality of pixels disposed in a display area, each pixel comprises one organic light emitting element and a drain pattern;
- a plurality of first voltage lines electrically connected to the plurality of pixels and that apply a common voltage to the organic emitting element of each pixel, the plurality of first voltage lines comprising a plurality of first common voltage lines extending in a first direction and a plurality of second common voltage lines extending in a second direction intersecting the first direction; and
- a plurality of second voltage lines electrically connected to the plurality of pixels and that apply a driving voltage to the organic emitting element of each pixel, the plurality of second voltage lines comprising a plurality of first driving voltage lines extending in the first direction and a plurality of second driving voltage lines extending in the second direction, wherein
- at least three of the first common voltage lines are disposed between adjacent first driving voltage lines, and each pixel being immediately surrounded on all sides by at least one of the first and second voltage lines,
- the second common voltage lines and the second driving voltage lines are disposed in a same layer in which the drain pattern is disposed,
- any two of the first driving voltage lines are arranged along the second direction with the first common voltage lines interposed between the any two of the first driving voltage lines, and
- the second common voltage lines and the second driving voltage lines are alternately arranged one by one along the first direction.

13. The display device of claim 12, wherein
the plurality of pixels further comprise:
- an active layer;
- a gate insulating layer covering the active layer;
- a gate electrode disposed on the gate insulating layer;
- an interlayer insulating layer covering the gate electrode;
- a first via layer disposed on the drain pattern; and
- a second via layer disposed on the first via layer, and
the drain pattern is electrically connected to the active layer.

14. The display device of claim 13, wherein the plurality of pixels further comprise a connection pattern disposed on the drain pattern,
- wherein the connection pattern is electrically connected to the drain pattern and the organic light emitting element.

15. The display device of claim 14, wherein the first common voltage lines and the first driving voltage lines are disposed in a same layer in which the connection pattern is disposed.

16. The display device of claim 13, wherein the first common voltage lines and the second common voltage lines are electrically connected to each other through a contact hole passing through the first via layer.

17. The display device of claim 13, wherein the first driving voltage lines and the second driving voltage lines are electrically connected to each other through a contact hole passing through the first via layer.

18. The display device of claim 12, wherein:
- the plurality of first voltage lines comprise a plurality of common voltage lines for supplying a common voltage to the plurality of pixels, and
- the plurality of second voltage lines comprise a plurality of driving voltage lines for supplying a driving voltage to the plurality of pixels.

* * * * *